United States Patent
Jang et al.

(10) Patent No.: US 8,303,856 B2
(45) Date of Patent: Nov. 6, 2012

(54) CONDUCTIVE LAMINATED BODY AND METHOD FOR PREPARING THE SAME

(75) Inventors: Hyeon Woo Jang, Daejeon (KR); Jungsik Bang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 546 days.

(21) Appl. No.: 12/449,743

(22) PCT Filed: Feb. 26, 2008

(86) PCT No.: PCT/KR2008/001097
§ 371 (c)(1),
(2), (4) Date: Aug. 25, 2009

(87) PCT Pub. No.: WO2008/105614
PCT Pub. Date: Sep. 4, 2008

(65) Prior Publication Data
US 2010/0089623 A1    Apr. 15, 2010

(30) Foreign Application Priority Data

Feb. 26, 2007  (KR) .................. 10-2007-0019081
Aug. 21, 2007  (KR) .................. 10-2007-0084208

(51) Int. Cl.
*H01B 1/08*    (2006.01)
*C23C 28/00*   (2006.01)
*B32B 9/00*    (2006.01)
*B05D 5/06*    (2006.01)

(52) U.S. Cl. ............... 252/519.51; 428/699; 204/192.29

(58) Field of Classification Search ............. 252/519.51; 428/212, 432, 699; 204/192.15, 192.29
See application file for complete search history.

(56) References Cited

U.S. PATENT DOCUMENTS
6,238,808 B1    5/2001   Arao et al.
(Continued)

FOREIGN PATENT DOCUMENTS
EP    1944386    7/2008
(Continued)

OTHER PUBLICATIONS

Nakamura et al "Transparent conducting films with zinc oxide system deposited on PET substrate by PLD method", Extended Abstract (The 67th Autumn Meeting, 2006) The Japan Society of Physics,31p-ZE-19, Sep. 1, 2009.*

(Continued)

*Primary Examiner* — Mark Kopec
(74) *Attorney, Agent, or Firm* — McKenna Long & Aldridge LLP

(57) ABSTRACT

Disclosed is a conductive laminated body, and a method for preparing the same, wherein the conductive laminated body including: a substrate; a zinc oxide-based thin film doped with an element M; and an interlayer including an oxide $M'_2O_3$, which is interposed between the substrate and the zinc oxide-based thin film. The disclosed conductive laminated body includes a metal oxide interlayer of an oxidation number +3, between a substrate and a zinc oxide layer. Therefore, it is possible to improve electrical properties of a transparent conductive thin film, especially, a resistivity property, and to minimize the unevenness in electrical properties between a middle portion and a circumferential portion on the surface of the thin film in sputtering deposition. Also, in deposition of a zinc oxide film, in addition to inert gas such as argon gas, the use of hydrogen gas can improve the concentration of electrons, and herein, the interposition of an interlayer including a metal oxide, between the substrate and the zinc oxide-based transparent conductive film, allows the heat-resistance/moisture-resistance stability and the uniformity of electrical properties.

16 Claims, 8 Drawing Sheets

U.S. PATENT DOCUMENTS

| | | |
|---|---|---|
| 6,940,631 B2 | 9/2005 | Ishikawa |
| 2005/0170158 A1 | 8/2005 | Hattori et al. |
| 2008/0166551 A1* | 7/2008 | Sasa et al. ............... 428/336 |

FOREIGN PATENT DOCUMENTS

| | | |
|---|---|---|
| JP | 08-325711 | 12/1996 |
| JP | 2002-075061 | 3/2002 |
| JP | 2006-073579 | 3/2006 |
| KR | 10-1999-0037486 A | 5/1999 |
| KR | 10-2005-0030500 | 3/2005 |
| KR | 10-0733915 B1 | 6/2007 |
| KR | 10-0797077 B1 | 1/2008 |
| KR | 10-2008-0112778 A1 | 12/2008 |

OTHER PUBLICATIONS

Shen et al "Structural and optical properties of ZnO films . . . ", J. Phys. D.: Appl. Phys. 39 (2006) 269-273.*

Ott et al. "Atomic layer-controlled growth of transparent conducting ZnO on plastic substrates", Materials Chemistry and Physics, vol. 58, No. 2 (Mar. 1999) pp. 132-138, XP002391281.

"Electrical and Optical Properties of ZnO: Al Films Prepared by the DC Magnetron Sputtering System", Eui-Soo Kim et al., Journal of the Korean Ceramic Society, vol. 32, No. 7, pp. 799-808, 1995.

* cited by examiner

CONDUCTIVE LAMINATED BODY AND METHOD FOR PREPARING THE SAME

This application claims the benefit of PCT/KR2008/001097 filed on Feb. 26, 2008 which claims priority to Korean Patent Application No. 10-2007-0019081 filed on Feb. 26, 2007 and Korean Patent Application No. 10-2007-0084208 filed on Aug. 21, 2007, all of which are hereby incorporated herein by reference for all purposes in their entirety.

TECHNICAL FIELD

The present invention relates to a conductive laminated body and a method for preparing the same, wherein the conductive laminated body has an improved resistivity property and uniform electrical properties on the entire surface.

BACKGROUND ART

In general, a transparent electrode is variously used for electrodes for a variety of displays, a photoelectric transformation element like a solar cell, a touch panel, etc., and is fabricated by forming a transparent conductive thin film on a transparent substrate such as glass, a transparent film, etc. As a transparent conductive material, tin (Sn) doped indium oxide (ITO) is mainly used at present, which is known to have high transparency and low resistivity ($1 \times 10^{-4} \sim 2 \times 10^{-4}$ Ωcm).

There are various methods of fabricating such a transparent conductive thin film, including a vacuum-deposition method, such as sputtering, chemical vapor deposition (CVD), ion beam deposition, pulsed laser deposition, etc., and a wet method, such as spray coating, spin coating, and dip coating. From among the various methods, a vacuum-deposition method, such as sputtering, is more preferred. In the vacuum-deposition method, the use of plasma allows a film having high particle energy to be grown, and thus, it is possible to obtain a film having good quality and higher density than other methods. In addition, even at low temperatures without additional heat treatment, a high quality of film can be obtained.

As a market for a flat display becomes wider, a demand for ITO has been recently rapidly increased. However, indium has instability in demand/supply due to its high cost and shortage, and is harmful to the human body. Therefore, a transparent conductive material of low cost, which can be substituted for ITO, is required to be developed.

As such substitutes, tin oxide ($SnO_2$), zinc oxide (ZnO), etc. have been considered. Specifically, a fabrication of a conductive thin film having low resistivity ($2 \times 10^{-4} \sim 3 \times 10^{-4}$ Ωcm) was tried by doping aluminum (Al) on zinc oxide. Zinc oxide (ZnO) is a semiconductor material having a wide band gap (~3.3 ev) and is known to have high transmittance (85% or more) and low resistivity through doping. Also, doped zinc oxide is relatively cheap and harmless to the human body, and thus has been noticed as a substitute material for ITO. At present, a transparent electrode material using zinc oxide (ZnO) added with aluminum (Al), gallium (Ga), silicon (Si), and/or indium (In) has been mainly researched, but such a material has a problem in that electrical conductivity is lower than that of ITO.

Usually, since resistivity of a transparent conductive film having a certain thickness is in inverse proportion to concentration of electrons and mobility ($\rho = 1/(e\mu N)$, e: electric charge, $\mu$: mobility, N: concentration of electrons), in order to decrease the resistivity ($\rho$) of a transparent electrode, the concentration or mobility of electrons is required to be increased. In order to easily increase the concentration of electrons, a method of increasing the amount of dopant included in a sputtering target may be used. However, when the concentration of electrons is more than a certain level ($N > 1 \times 10^{20}$ cm$^{-3}$), the mobility is decreased by collision between electrons and dopant functioning as a scattering center (when $N < 1 \times 10^{20}$ cm$^{-3}$, the mobility depends on the scattering on grain boundary). In other words, the increase in the concentration of electrons, which is obtained by increasing the amount of dopant included in the sputtering target, is accompanied with the decrease in the mobility, and accordingly, the resistivity is maintained as it is, or even increased. Such a relationship between the concentration of electrons and the mobility is experimentally known by many researchers. Accordingly, the conventional method has a limitation in improving an electrical property of a transparent conductive film.

Also, in depositing a film by using sputtering, the deposited film is damaged by high energy of sputtering particles, thereby causing unevenness of resistivity. Such unevenness of resistivity may be solved by changing the position of a substrate or the position of a magnet within a sputter device during a process of depositing a film, but this method cannot fundamentally solve the problem.

DISCLOSURE OF THE INVENTION

Therefore, the present invention has been made in view of the above-mentioned problems. The present inventors found the fact that in preparing a zinc oxide-based thin film on a substrate, the interposition of an interlayer including a metal oxide having an oxidation number +3, between the substrate and the zinc oxide-based thin film, can increase the concentration of electrons without a reduction of electron mobility, and can improve the resistivity property by removing defects being caused by high energy particles in sputtering.

Also, the inventors found that uniform distribution of electrical properties on the surface of a thin film can be achieved by the metal oxide interlayer, and this effect is more efficient at high power.

In the deposition of a zinc oxide thin film, the use of hydrogen gas improves the resistivity property of the thin film, but causes the degradation of heat-resistance/moisture-resistance of the thin film and the unevenness of the distribution of electrical properties. The use of such a metal oxide interlayer can solve this problem.

Also, the use of the metal oxide interlayer can achieve the resistivity with a certain level regardless of the kinds of glass substrate (for example, soda-lime glass or TFT glass).

The present invention is based on the above described facts.

According to an aspect of the present invention, there is provided a conductive laminated body including: a substrate: a zinc oxide-based thin film doped with an element M; and an interlayer including an oxide $M'_2O_3$, which is interposed between the substrate and the zinc oxide-based thin film, wherein the zinc oxide-based thin film has a second XRD peak, which is shifted by +0.05°~+0.5° from a first XRD peak occurring when there is no interlayer.

According to another aspect of the present invention, there is provided a method for preparing the conductive laminated body, the method comprising the steps of: a) forming an interlayer including an oxide $M'_2O_3$ on a substrate; and b) forming a zinc oxide-based thin film doped with an element M on the interlayer.

According to a further aspect of the present invention, there is provided a method for preparing a conductive laminated body comprising a substrate, a zinc oxide-based thin film doped with an element M, and an interlayer including an oxide M'$_2$O$_3$, which is interposed between the substrate and the zinc oxide-based thin film, the method including the steps of: forming the interlayer including the oxide M'$_2$O$_3$ on the substrate; and forming the zinc oxide-based thin film doped with the element M on the interlayer, wherein the zinc oxide-based thin film is deposited in gas including hydrogen (herein, each of M and M' is independently an element selected from the group consisting of group 13 elements and transition metals having an oxidation number of +3, and the first XRD peak and the second XRD peak correspond to a (002) peak of zinc oxide (ZnO) at 2θ=34°±0.5° at CuKα (λ=0.154 nm) radiation).

Hereinafter, the present invention will be described in detail.

In the present invention, between a substrate and a zinc oxide-based thin film layer, an interlayer including a metal oxide having an oxidation number of +3 is interposed, thereby decreasing the resistivity of a zinc oxide-based thin film. In addition, the entire surface of the thin film can have uniform electrical properties.

As described above, a method of increasing the concentration of dopant in order to increase the concentration of electrons, which is one of the methods of decreasing the resistivity of a zinc oxide-based thin film, has had a problem in that a desired resistivity value cannot be obtained because the mobility is decreased by collision between electrons. However, in the present invention, the interposition of an interlayer can increase the concentration of electrons without a reduction of electron mobility, while maintaining the concentration of dopant included in a sputtering target as it is.

Although the reason for the above described increase in the concentration of electrons is not yet clearly known, it is assumed that 1) diffusion of cations included in an oxide increases the concentration of dopant within a zinc oxide thin film; or 2) the interlayer removes a defect capable of functioning as an acceptor within the zinc oxide thin film, thereby eliminating the effect of the decrease in the concentration of electrons.

Specifically, during deposition of the zinc oxide thin film by sputtering, oxygen particles (O$^-$) dissociated from a target material, that is, zinc oxide, have high energy by self-bias of the target. Such particles having high energy are incorporated in a transparent conductive film, and thus function as an interstitial defect, or else, cause a defect by collision with a thin film. Such an oxygen interstitial defect (Oi defect) functions as an acceptor within the zinc oxide thin film, and thus may cause a decrease in the concentration of electrons. Also, such a defect may operate as a scattering center, thereby decreasing electron mobility. Accordingly, such operations of the defect may result in the increase in the resistivity of the transparent conductive film.

However, in the present invention, the interposition of an interlayer including an oxide of a metal having an oxidation number of +3 can eliminate defects such as the above described interstitial oxygen defect, thereby decreasing the resistivity of a film.

This effect can be found from the shift of zinc oxide (002) peak in X-ray Diffraction analysis (XRD analysis) on the zinc oxide-based thin film. When there exists a plurality of defects or stresses within the thin film, the zinc oxide (002) peak occurring in the vicinity of 2θ=34° at XRD analysis has an asymmetrical shape, and is present at a lower angle than the standard position of ZnO (002) peak based on JCPDS (Joint Committee on Powder Diffraction Standards). However, in the present invention, when an oxide of a metal having an oxidation number of +3 is interposed as an interlayer, the asymmetrical shape becomes symmetrical, and also the position of the peak is shifted to a higher angle. Such changes indicate that the interlayer has decreased defects and stresses, especially, interstitial oxygen defects, within the transparent conductive film.

Although the reason why an interlayer decreases the above described defects is not yet clearly known, it is assumed that 1) the operation of oxygen particles (O$^-$) having high energy is offset by interactions with oxygen included in the oxide interlayer, and thus a generation of defects is eliminated at the initial stage of sputtering; or 2) the oxide interlayer causes the electric field applied to a substrate to be changed, thereby lessening the operations of the oxygen particles (O$^-$) having high energy.

Herein, the shift value of the XRD peak may be different according to the measurement conditions, but it is preferable that in the case of CuKα(λ=0.15405 nm) radiation, the peak of a conductive film including an interlayer is present at a higher angle than that of another film not including an interlayer, by +0.05°~+0.5. When the shift value of the XRD peak is less than the above described range, the improvement of a resistivity property by the interposition of the interlayer is insignificant, and on the other hand, when the value is more than the above described range, transformation and/or stress of a crystal lattice occur, thereby adversely affecting the resistivity property.

In the present invention, since a metal oxide interlayer is interposed between a substrate and a zinc oxide-based thin film, the entire surface of the thin film can have uniform electrical properties. Conventionally, in depositing of a zinc oxide thin film by sputtering, there may be a difference in electrical properties between a middle portion and a circumferential portion on the surface of the thin film, because particles having high energy collide with the middle portion, and thus cause multiple defects and stresses at the middle portion, thereby causing the local degradation of electrical properties, such as resistivity. Such unevenness of the physical properties may block the application of a transparent conductive film to various fields. The above-described unevenness (especially, being serious upon a middle portion of a thin film) may depend on the size ratio of a target and a substrate, or may be caused by the properties of a deposition material. In other words, when the deposition material is ITO (Indium Zinc Oxide), the unevenness of electrical properties hardly occurs on the entire surface of a thin film regardless of the size of a target and a substrate, and on the other hand, when the deposition material is zinc oxide, the unevenness may significantly occur.

However, according to the present invention, when an oxide of a metal having an oxidation number of +3 is interposed as an interlayer, the oxide interlayer can reduce the occurrence of defects caused by the collision of the high energy particles. Therefore, a transparent conductive film having uniform electrical properties on the entire surface of the thin film can be prepared.

This effect is more efficient when high deposition power is used. High deposition power increases the flux of sputter particles, thereby increasing the deposition rate of a thin film, but in addition to the flux, energy of sputter particles is also increased, thereby causing serious damage to a deposited film and increasing the unevenness of resistivity. Herein, the use of a metal oxide interlayer can minimize the unevenness of resistivity and increase the deposition rate (see, FIG. 5).

In addition to the above described effect, the use of a metal oxide interlayer according to the present invention can minimize the unevenness of resistivity regardless of the kind of a substrate, specifically, regardless whether a glass substrate is soda-lime glass or TFT glass. The soda-lime glass is usually difficult to use as a substrate material for a transparent conductive film due to the increase of resistivity caused by the penetration of sodium. However, when a metal oxide interlayer according to the present invention is used, it is possible to achieve the same resistivity as that of TFT glass by using soda-lime glass (see FIG. 9).

Accordingly, due to an interlayer including an oxide of a metal having an oxidation number of +3, a conductive laminated body according to the present invention can have a variation within a range of 0.01%~60% in resistivities measured on at least two spots within a zinc oxide-based thin film.

In the present invention, the zinc oxide-based thin film may be represented by formula ZnO:M, and herein, M represents a dopant element, which may be a group 13 element or a transition metal having an oxidation number of +3, and non-limiting examples of M include B, Al, Ga, In, Tl, Sc, V, Cr, Mn, Fe, Co, Ni, etc.

The dopant element can be doped, as a cation having an oxidation number of +3, on zinc oxide (ZnO), and herein, the element functions as N type dopant of substituting for the position of Zn and generating surplus electrons, thereby increasing the concentration of electrons within the zinc oxide-based transparent conductive film. In order to prevent the mobility of electrons being decreased, the concentration of the dopant is preferably within a range of 0.1~10 wt %.

The interlayer thin film according to the present invention may include an oxide of $M'_2O_3$. Herein, M represents a dopant element, which may be a group 13 element or a transition metal having an oxidation number of +3, and non-limiting examples of M include oxides of group 13 elements of the Periodic Table ($B_2O_3$, $Al_2O_3$, $Ga_2O_3$, $In_2O_3$, $Tl_2O_3$) or transition metal oxides ($Sc_2O_3$, $V_2O_3$, $Cr_2O_3$, $Mn_2O_3$, $Fe_2O_3$, $CO_2O_3$, $Ni_2O_3$).

When another oxide (for example, $SiO_2$, etc.) than $M'_2O_3$ is used as an interlayer thin film, shift of ZnO (002) peak at XRD hardly occurs, and a decrease in the resistivity of a zinc oxide-based thin film is insignificant (see Comparative Example 4, and FIG. 7).

In the present invention, it is preferable that a cation M' of the oxide included in the interlayer, and a dopant element M included in the zinc oxide-based thin film are the same elements. Although as long as both cation elements of the dopant and the oxide have an oxidation number of +3, the shift of XRD peak and the decrease in resistivity occur as described above, this effect can be amplified when the cation elements of the dopant and the oxide are the same (see, FIG. 5). Also, in the present invention, it is more preferable that the combination of the dopant M and an oxide $M'_2O_3$ included in the interlayer is Al and $Al_2O_3$ or Ga and $Ga_2O_3$. As described above, although it is preferable that M and M' are the same elements, the present invention is not limited to that as long as M and M' are cations having an oxidation number of +3.

A substrate that may be used in the present invention is not particularly limited as long as the substrate has transparency, and non-limiting examples of the substrate include a glass substrate and a plastic substrate. Non-limiting examples of the glass substrate include soda-lime glass, TFT glass, etc., and non-limiting examples of the plastic substrate include PET (polyethylene terephthalate), PEN (polyethylene 2,6-naphthalate), PES (polyether sulfone), PEI (polyether imide), PMMA (polymethylmethacrylate), PC (polycarbonate), etc.

In the present invention, the thickness of the interlayer and the thickness of the zinc oxide-based thin film are not particularly limited, but it is preferable that each thickness is independently within a range of 10~300 nm. When the thickness of the interlayer is less than 10 nm, the entire coverage is problematic, and when the thickness is more than 300 nm, surface roughness is increased. Also, when the thickness of the zinc oxide-based thin film is less than 10 nm, the crystallinity is decreased.

The conductive laminated body according to the present invention may be preferably used as a transparent conductive film, and also may be applied to TFT (Thin Film Transistor), etc., but is not limited to a particular usage.

The conductive laminated body according to the present invention may be prepared by the steps of:

a) forming an interlayer including $M'_2O_3$ on a substrate; and b) forming a zinc oxide-based thin film (ZnO:M) on the interlayer.

In the present invention, the zinc oxide-based thin film may be deposited by PVD (Physical Vapor Deposition) such as ion-plating, sputtering, etc., and the interlayer may be deposited by CVD (Chemical Vapor Deposition) or PVD (Physical Vapor Deposition), such as evaporation, ion-plating, sputtering, etc.

The interlayer and the zinc oxide-based thin film may be preferably deposited by sputtering, and more preferably deposited by RF magnetron sputtering (Radio Frequency Magnetron Sputtering). However, the present invention is not limited to the above-described method, and is not particularly limited as long as the method is a method of depositing a thin film.

For example, in an embodiment of a method preparing a thin film according to the present invention, the method includes the steps of: opposing a substrate and a metal oxide target to each other at a certain interval in a sputtering chamber; changing argon (Ar) gas into plasma; and accelerating the argon plasma by bias voltage applied to the target, and colliding the plasma with the target. A target material separated by the collision of the argon plasma is deposited onto the substrate to form a metal oxide thin film. In the same system, a zinc oxide-based thin film may be deposited onto the substrate on which the metal oxide interlayer is formed in the same manner as described above, except that the target is changed from the metal oxide to zinc oxide. Herein, the thickness of the thin film may be easily adjusted by adjusting a time for sputtering, etc.

Especially, in a preparation method according to the present invention, since a metal oxide thin film and a zinc oxide-based transparent conductive film can be sequentially deposited in one system, there is an advantage in that it is possible to easily prepare a thin film without complicated processes. However, the scope of the present invention is not limited to the method of sequentially depositing the metal oxide thin film and the zinc oxide-based thin film in one system. Each thin film may be independently deposited. For example, a metal oxide thin film may be deposited onto a substrate in one system, and then a zinc oxide-based thin film may be deposited in another chamber.

In the preparation method according to the present invention, in deposition for forming the zinc oxide-based thin film, the temperature range is not particularly limited. However, at too high or low deposition temperatures, it is difficult to form a zinc oxide-based thin film having good crystallinity. The crystallinity has a direct influence on the concentration of electrons or mobility. Accordingly, the deposition can be preferably carried out in an elevated temperature range, and more preferably in a range of 100~400° C.

In another embodiment of the present invention, when an element-M doped zinc oxide-based thin film is formed on a substrate, the deposition is performed in gas including hydrogen, thereby improving electrical properties of the zinc oxide-based thin film. Herein, between the substrate and the element-M doped zinc oxide-based thin film, an interlayer including an oxide $M'_2O_3$ is interposed, thereby improving the heat-resistance/moisture-resistance stability and the uniformity of resistivity.

In forming the element-M doped zinc oxide-based thin film on the substrate, when deposition, preferably deposition in an elevated temperature range, is performed in gas including hydrogen, oxygen vacancy occurs by hydrogen gas. Such oxygen vacancy operates as an electron donor, thereby increasing the concentration of electrons. Accordingly, the resistivity of the zinc oxide-based thin film is decreased, thereby improving the electrical properties. However, the deposition in gas including hydrogen may cause a problem in that electrical properties of a thin film are degraded under high temperature and high humidity. Accordingly, in the deposition, the interposition of an interlayer including an oxide $M'_2O_3$, between the substrate and the element-M doped zinc oxide-based thin film, improves the uniformity of the electrical properties of the thin film, and the heat-resistance/moisture-resistance stability for the electrical properties of the thin film.

Although the reason why electrical properties of a thin film are degraded under high temperature and high humidity is not yet clearly known, it is assumed that one reason is the penetration of moisture or a foreign substance through a substrate. The use of a metal oxide interlayer according to the present invention is expected to be a barrier for blocking the penetration of moisture or foreign substance.

Herein, the improvement in heat-resistance/moisture-resistance stability by the interposition of the interlayer is significant when the thickness of a zinc oxide-based thin film is thin. This is shown in FIGS. 8 and 9.

In the present invention, the gas including hydrogen may include hydrogen and inert gas, and non-limiting examples of the inert gas include argon gas, etc.

Optionally, in forming an interlayer including an oxide $M'_2O_3$ on the substrate, a target including an oxide $M'_2O_3$ may be deposited in the gas including hydrogen.

In the present invention, the hydrogen gas is in an amount of 0.1 to 20 vol % based on the total gas. When the content of the hydrogen gas is less than 0.1 vol %, the effect of improving electrical properties is insignificant, and on the other hand, when the content is more than 20 vol %, the thickness of the zinc oxide-based thin film may be decreased by an etching effect.

In the conductive laminated body according to the present invention prepared by deposition in the gas including hydrogen, since the deposition may be performed in an elevated temperature range, and more preferably within a range of 100~400° C., it is preferable that the substrate is heat-resistant within the above described temperature range. As the substrate, a glass substrate or a heat-resistant (at 100~400° C.) polymer substrate may be used.

BRIEF DESCRIPTION OF THE DRAWINGS

The foregoing and other objects, features and advantages of the present invention will become more apparent from the following detailed description when taken in conjunction with the accompanying drawings in which.

DESCRIPTION OF REFERENCE NUMERALS

Figure 1:
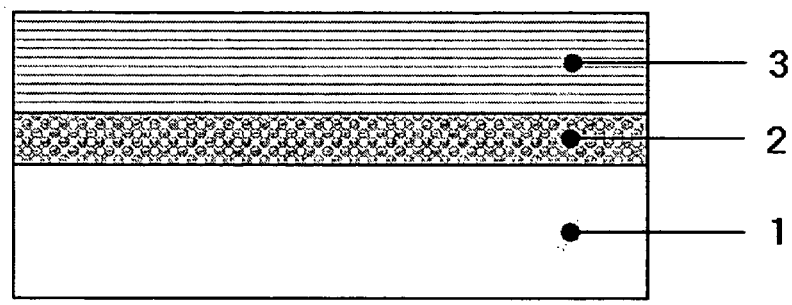
FIG. 1 is a cross-sectional view of a transparent conductive film prepared according to Example 1.

1: substrate
2: metal oxide interlayer
3: zinc oxide based thin film

BEST MODE FOR CARRYING OUT THE INVENTION

Reference will now be made in detail to the preferred embodiments of the present invention. However, the following examples are illustrative only, and the scope of the present invention is not limited thereto.

Example 1

Preparation of a Conductive Laminated Body—Al Doped ZnO/$Al_2O_3$ Interlayer/Glass <Deposition of Interlayer>

Onto a glass substrate (TFT glass), an $Al_2O_3$ thin film was deposited by RF magnetron sputtering. As a sputtering target, an $Al_2O_3$ sintered body target was used, and three test samples of the deposited $Al_2O_3$ thin film of were prepared. Herein, the test samples had thickness of 19 nm, 20 nm, 32 nm, respectively.

In addition, bias voltage was about −350V, the pressure within a chamber was $3 \times 10^{-3}$ torr, and the flow rate of argon gas was 50 sccm.

<Deposition of Zinc Oxide-Based Transparent Conductive Film>

Onto the prepared $Al_2O_3$ interlayer, a ZnO (2 wt % of Al was doped) thin film was deposited by RF magnetron sputtering to obtain a conductive laminated body. As a sputtering target, a ZnO (2 wt % of Al was doped) sintered body target was used, and the thickness of the deposited ZnO thin film was 140 nm (±7 nm). Other sputtering conditions were the same as those of the deposition of the interlayer.

Example 2

Preparation of a Conductive Laminated Body—Ga Doped ZnO/Ga$_2$O$_3$ Interlayer/Glass A conductive laminated body was prepared in the same manner as described in Example 1, except that Ga$_2$O$_3$ was deposited as an interlayer, and 5.5 wt % of Ga was doped on ZnO.

Example 3

Preparation of a Conductive Laminated Body—Ga Doped ZnO/Al$_2$O$_3$ Interlayer/Glass A conductive laminated body was prepared in the same manner as described in Example 1, except that 5.5 wt % of Ga was doped on ZnO.

Example 4

Preparation of a Conductive Laminated Body—Ga Doped ZnO/Al$_2$O$_3$ Interlayer/Glass A conductive laminated body was prepared in the same manner as described in Example 3, except that soda-lime glass, instead TFT glass, was used as a glass substrate.

Comparative Example 1

Preparation of a Conductive Laminated Body—Al Doped ZnO/Glass

A conductive laminated body was prepared in the same manner as described in Example 1, except that an interlayer was not deposited, and ZnO (2 wt % of Al was doped) was directly deposited on a glass substrate.

Comparative Example 2

Preparation of a Conductive Laminated Body—Ga Doped ZnO/Glass

A conductive laminated body was prepared in the same manner as described in Example 3, except that an interlayer was not deposited, and ZnO (5.5 wt % of Ga was doped) was directly deposited on a glass substrate.

Comparative Example 3

Preparation of a Conductive Laminated Body—Ga Doped ZnO/Glass

A conductive laminated body was prepared in the same manner as described in Example 4, except that an interlayer was not deposited, and ZnO (5.5 wt % of Ga was doped) was directly deposited on a glass substrate (soda-lime glass).

Comparative Example 4

Preparation of a Conductive Laminated Body—Al Doped ZnO/SiO$_2$ Interlayer/Glass A conductive laminated body was prepared in the same manner as described in Example 1, except that SiO$_2$ was deposited as an interlayer.

Example 5

Preparation of a Conductive Laminated Body—Ga Doped ZnO/Al$_2$O$_3$ Interlayer/Glass with H$_2$ <Deposition of Interlayer>

Onto a glass substrate, an Al$_2$O$_3$ thin film was deposited by RF magnetron sputtering. As a sputtering target, an Al$_2$O$_3$ sintered body target was used, and the thickness of the deposited Al$_2$O$_3$ thin film was 55 nm.

In addition, bias voltage was about −260V, the pressure within a chamber was 3×10$^{-3}$ torr, and the flow rate of argon gas was 50 sccm.

<Deposition of Zinc Oxide-Based Transparent Conductive Film>

Onto the prepared Al$_2$O$_3$ interlayer, a ZnO (5.5 wt % of Ga was doped) thin film was deposited by RF magnetron sputtering to obtain a conductive laminated body. As a sputtering target, a ZnO (5.5 wt % of Ga was doped) sintered body target was used, and the thickness of the deposited ZnO thin film was 150 nm.

In addition, sputtering power was 85 W, bias voltage was about −350V, the pressure within a chamber was 3×10$^{-3}$ torr, the flow rate of a mixed gas of H$_2$/Ar (the ratio of H$_2$/Ar was 2.8 vol %) was 50 sccm, and the deposition temperature was 200° C.

Example 6

Preparation of a Conductive Laminated Body—Ga Doped ZnO/Al$_2$O$_3$ Interlayer/Glass with H$_2$ A conductive laminated body was prepared in the same manner as described in Example 5, except that the zinc oxide-based transparent conductive film was deposited with a thickness of 30 nm.

Example 7

Preparation of a Conductive Laminated Body—Ga Doped ZnO/Al$_2$O$_3$ Interlayer/Glass A conductive laminated body was prepared in the same manner as described in Example 5, except that Ga doped ZnO (5.5 wt % of Ga was doped) was grown at sputtering power of 200 W.

Comparative Example 5

Preparation of a Conductive Laminated Body—Ga Doped ZnO/Glass without H$_2$

A conductive laminated body was prepared in the same manner as described in Example 5, except that an interlayer was not deposited, ZnO (5.5 wt % of Ga was doped) was directly deposited on a glass substrate, and hydrogen gas was not used at deposition.

Comparative Example 6

Preparation of a Conductive Laminated Body—Ga Doped ZnO/Glass with H$_2$

A conductive laminated body was prepared in the same manner as described in Example 5, except that an interlayer was not deposited, and ZnO (5.5 wt % of Ga was doped) was directly deposited on a glass substrate.

Comparative Example 7

Preparation of a Conductive Laminated Body—Ga Doped ZnO/Glass without $H_2$

A conductive laminated body was prepared in the same manner as described in Example 6, except that an interlayer was not deposited, ZnO (5.5 wt % of Ga was doped) was directly deposited on a glass substrate, and hydrogen gas was not used at deposition.

Comparative Example 8

Preparation of a Conductive Laminated Body—Ga Doped ZnO/Glass with $H_2$

A conductive laminated body was prepared in the same manner as described in Example 6, except that an interlayer was not deposited, and ZnO (5.5 wt % of Ga was doped) was directly deposited on a glass substrate.

Comparative Example 9

Preparation of a Conductive Laminated Body—Ga Doped ZnO/Glass

A conductive laminated body was prepared in the same manner as described in Example 7, except that an interlayer was not deposited, ZnO (5.5 wt % of Ga was doped) was directly deposited on a glass substrate at sputtering power of 200 W, and hydrogen gas was not used at deposition.

Experimental Example 1

On each of the transparent conductive films prepared according to Examples and Comparative Examples, the concentration of electrons, mobility, and resistivity were measured by hall-effect measurement, the thickness was measured by ST2000-DLX (Kmac, Korea), and XRD analysis (X-Ray Diffraction analysis) was performed using CuKα ($\lambda$=0.154 nm) radiation.

The property analyses (shown in FIGS. 3, 5, 7, 8, and 9) at predetermined positions on the surfaces of conductive films were performed by measuring electrical properties at predetermined spots 1(−1), 2(−2), 3(−3), and 4(−4). Herein, the predetermined spots 1(−1), 2(−2), 3(−3), and 4(−4) were sequentially positioned at an equal interval in both directions from 0 when the center of a conductive film is 0, and on a straight line which is passing the center and crossing the conductive film.

Figure 2:
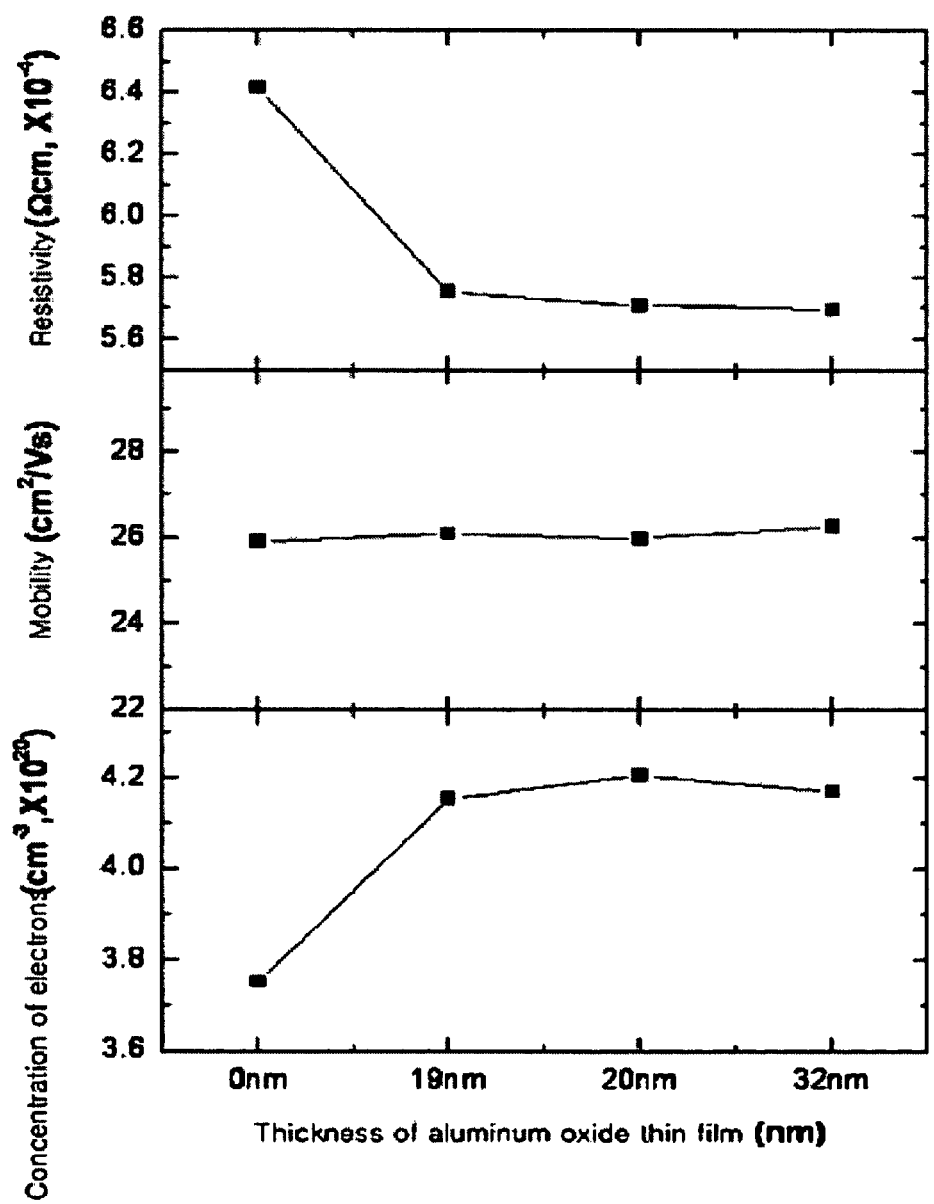
FIG. 2 illustrates the electrical properties of transparent conductive films prepared according to Example 1 and Comparative Example 1.

FIG. 2 illustrates the electrical properties of transparent conductive films prepared according to Example 1 and Comparative Example 1 (the thickness of an aluminum oxide thin film: 0 nm). In Example 1 including an interlayer of $Al_2O_3$, compared to a Comparative Example 1 not including an interlayer, the concentration of electrons was increased and the mobility was almost constant. In other words, even in sputtering with the same target, an effect of reducing the resistivity can be achieved by the interlayer of $Al_2O_3$. However, the correlation between the thickness of an interlayer of $Al_2O_3$ and the electrical properties of a transparent conductive film is not shown.

Figure 3:
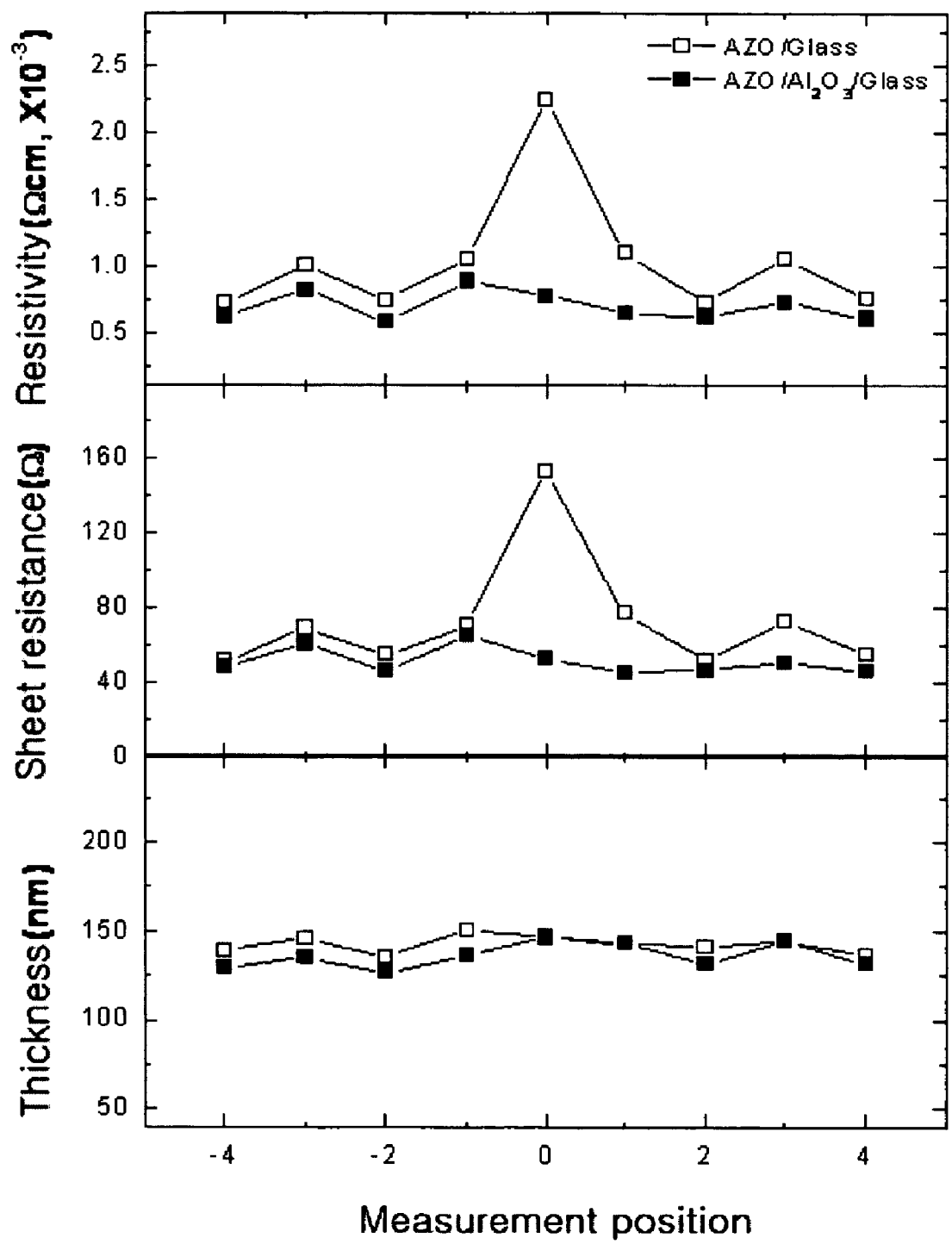
FIG. 3 illustrates the electrical properties of transparent conductive films prepared according to Example 1 and Comparative Example 1, which are measured at predetermined positions on the conductive films.

FIG. 3 illustrates the electrical properties of transparent conductive films prepared according to Example 1 and Comparative Example 1, which are measured at predetermined positions on the conductive films. As shown in FIG. 3, the differences in the thickness of thin films have no relation to whether an aluminum oxide interlayer exists or not. However, the electrical properties significantly depend on whether an aluminum oxide interlayer exists or not. In Comparative Example 1 not including the aluminum oxide interlayer, the sheet resistance and resistivity were suddenly increased at a middle portion (position 0). It is determined that defects formed by collision of high energy particles may cause such a sudden increase. On the other hand, in Example 1 including the aluminum oxide interlayer, there was no significant difference in the sheet resistance and resistivity between a middle portion (position 0) and other positions. It is determined that the aluminum oxide thin film decreased defects formed by collision of high energy particles.

Figure 4:
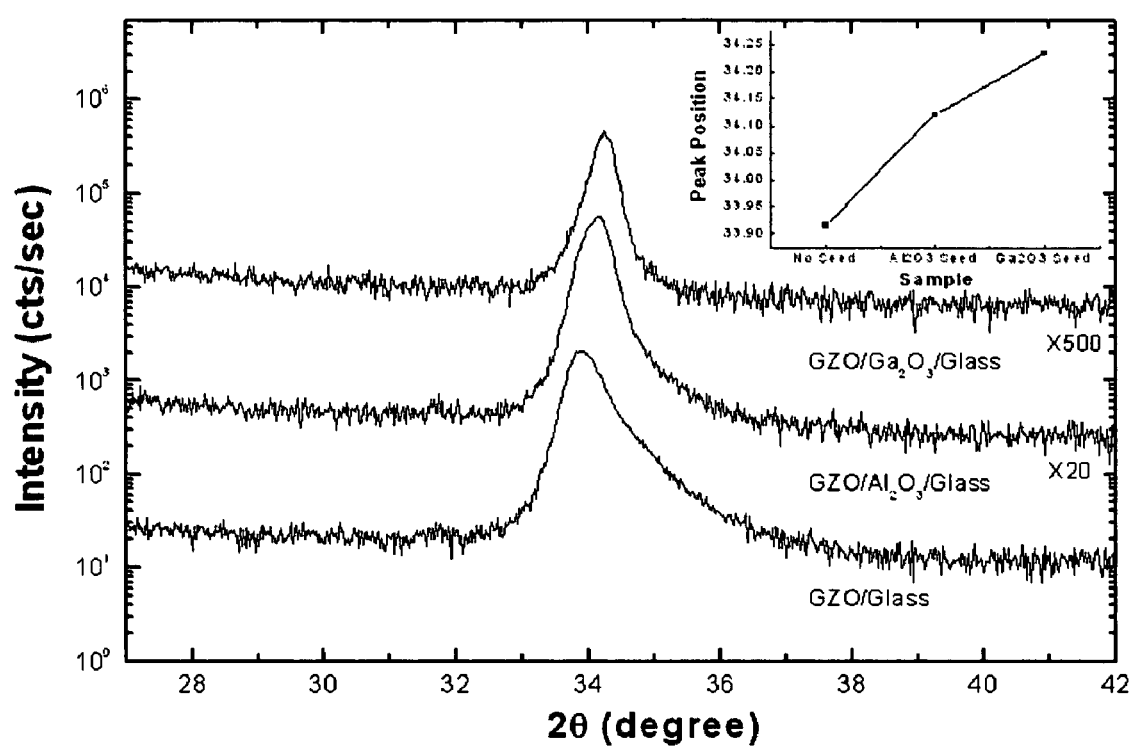
FIG. 4 illustrates the XRD analyses of transparent conductive films prepared according to Examples 2 and 3, and Comparative Example 2.

FIG. 4 illustrates the XRD analyses of transparent conductive films prepared according to Examples 2 and 3, and Comparative Example 2. In Comparative Example 2 not including an interlayer, the (002) peak at 2θ=34° has an asymmetric shape, and occurs at a lower angle than a conventionally known ZnO (002) peak (based on JCPDS (Joint Committee on Powder Diffraction Standards)). It is known that such a result is caused by a plurality of defects and stresses within a thin film. On the other hand, when aluminum oxide or gallium oxide was interposed as an interlayer, the peak has a symmetric shape, and is shifted to a higher angle. This indicates that the interlayer decreased defects and stresses within the transparent conductive film. Accordingly, it is determined that the uniformity of electrical properties over the entire surface as shown in FIG. 3 is because the interlayer lessened the damage caused by collision of particles having high energy.

Figure 5:
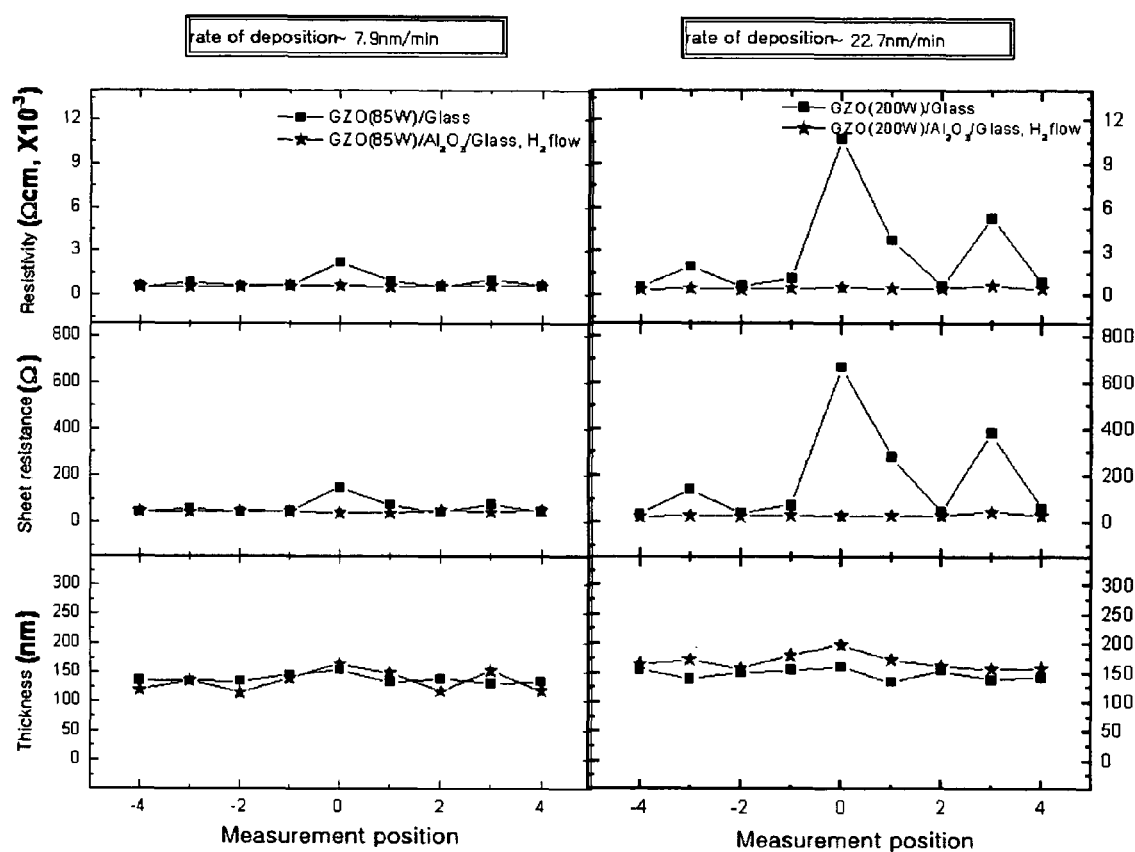
FIG. 5 illustrates the electrical properties of transparent conductive films prepared according to Examples 5 and 7 and Comparative Examples 5 and 9, which are measured at predetermined positions on the conductive films.

FIG. 5 illustrates the electrical properties of transparent conductive films prepared according to Examples 5 and 7 and Comparative Examples 5 and 9, which are measured at predetermined positions on the conductive films. At an increased deposition power of 200 W, when an interlayer was not used, the resistivity at a middle portion (measurement position 0) was suddenly increased because the increased deposition power increased the energy of sputtering particles, thereby increasing damage to the film. In this case, when an interlayer is used, it is possible to achieve uniform resistivity regardless of the deposition power. In other words, the use of the interlayer allows a transparent conductive film to be grown with a high deposition rate without degradation of a resistivity property.

Figure 6:
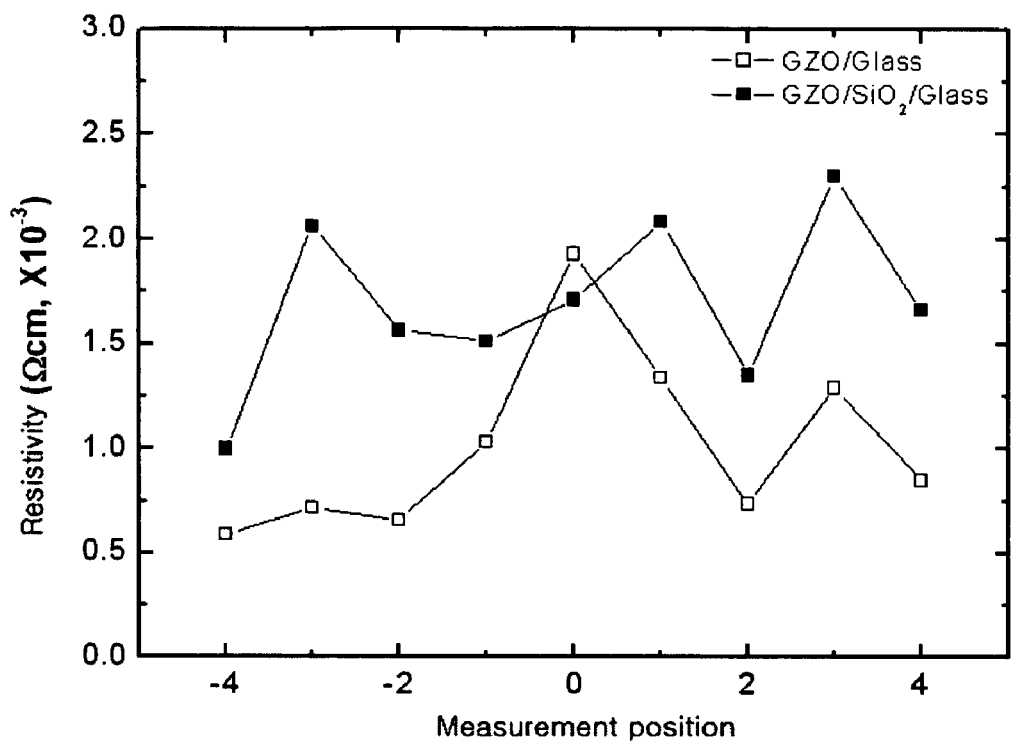
FIG. 6 illustrates the resistivities of a transparent conductive film prepared according to Comparative Example 4, which are measured at predetermined positions on the conductive film, and the XRD analysis of the transparent conductive film.
Figure 6:
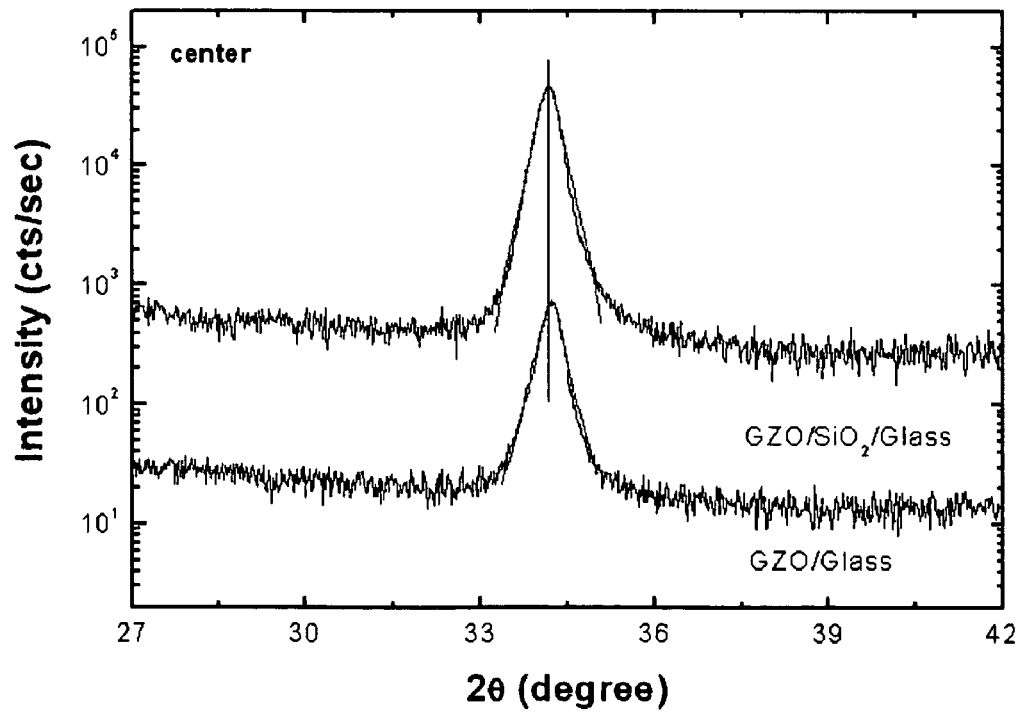

FIG. 6 illustrates the resistivity and XRD analysis on a zinc oxide thin film including a $SiO_2$ interlayer, which is prepared according to Comparative Example 4. The result does not show the shift of XRD peak and a decrease in resistivity. However, it is determined that, compared to a film not including an interlayer, the uniformity in electrical properties between a middle portion and a circumferential portion of the thin film was improved.

Figure 7:
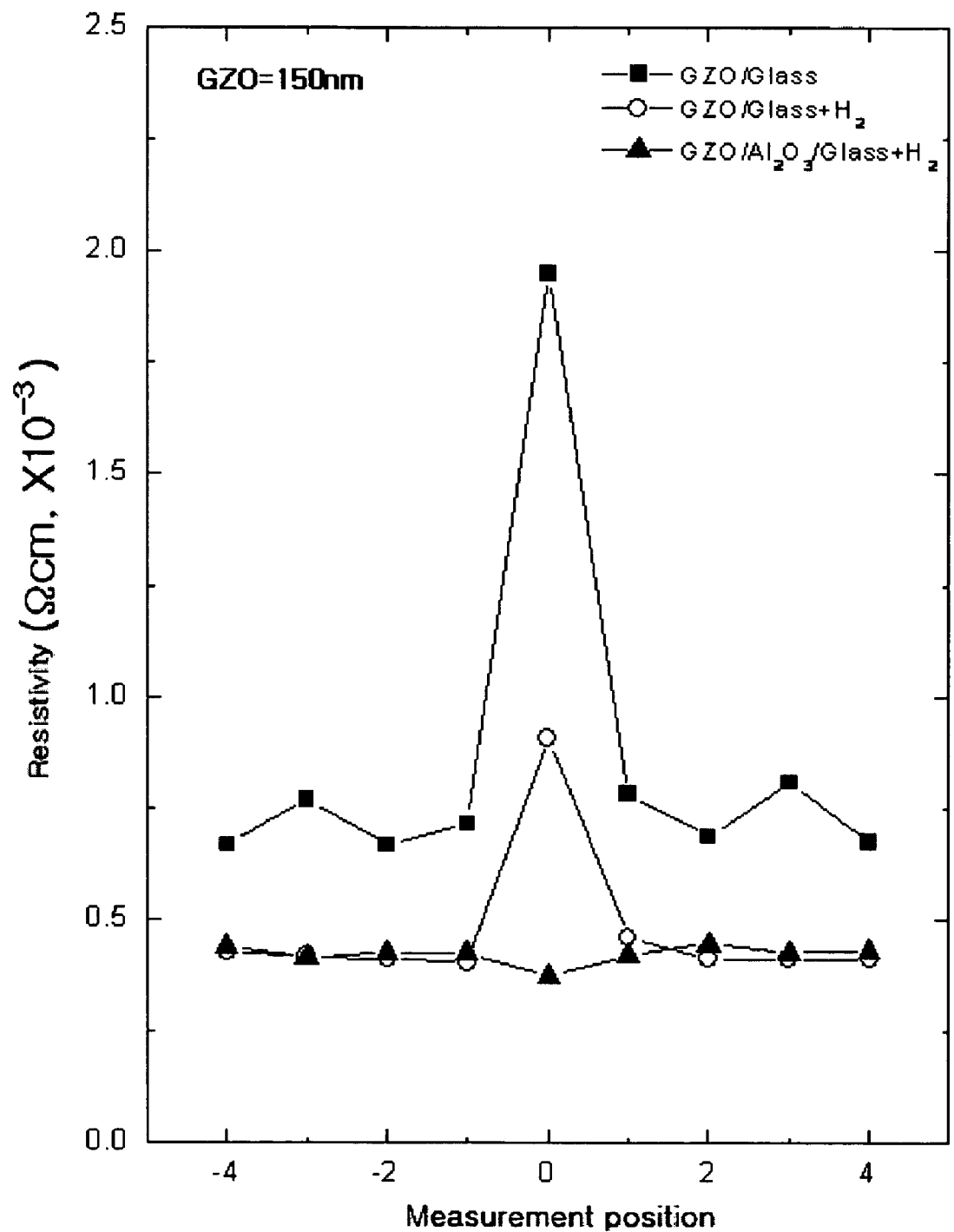
FIG. 7 illustrates the resistivities of transparent conductive films prepared according to Example 5 and Comparative Examples 5 and 6, which are measured at predetermined positions on the conductive films.

FIG. 7 illustrates the resistivities of transparent conductive films prepared according to Example 5 and Comparative Examples 5 and 6, which are measured at predetermined positions on the conductive films. As shown in FIG. 7, in Comparative Example 5, where an aluminum oxide interlayer was not deposited and hydrogen was not used, the uniformity of resistivity at measurement positions was very poor. At a middle portion (position 0), the resistivity was suddenly increased, which is determined that the collision of high energy particles formed defects. In Comparative Example 6 where hydrogen gas was used to grow a zinc oxide-based transparent conductive film, although the distribution of resistivity is similar to Comparative Example 5 (in other words, the uniformity is not good), the overall values are reduced. It is determined that such a result was caused by the increase in the concentration of electrons by hydrogen gas. In Example 5, where an aluminum oxide interlayer was deposited and hydrogen gas was used, the resistivity was significantly decreased, and the uniformity at measurement positions was good. It is determined that such a result is caused by an effect by both the aluminum oxide interlayer and the hydrogen gas.

Figure 8:
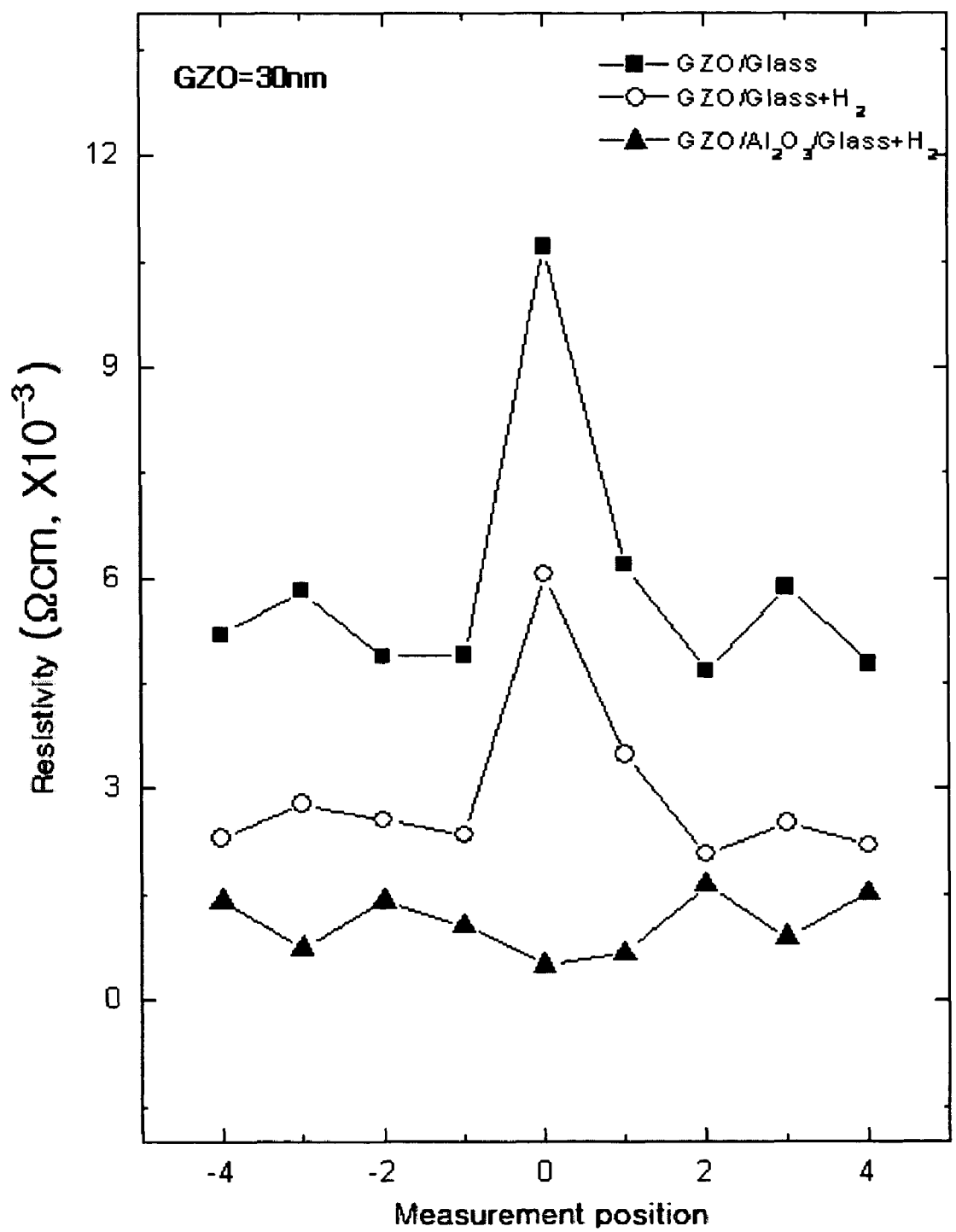
FIG. 8 illustrates the resistivities of transparent conductive films prepared according to Example 6 and Comparative Examples 7 and 8, which are measured at predetermined positions on the conductive films.

FIG. 8 illustrates the resistivities of transparent conductive films prepared according to Example 6 and Comparative Examples 7 and 8, which are measured at predetermined positions on the conductive films. As shown in FIG. 8, although the thickness (30 nm) of the zinc oxide-based transparent conductive film is different from FIG. 7, the results are similar to that of FIG. 7. However, compared to FIG. 7, in the case where the thickness of the zinc oxide-based transparent conductive film is thin, the effect by an aluminum oxide interlayer or hydrogen gas was more significant.

Figure 9:
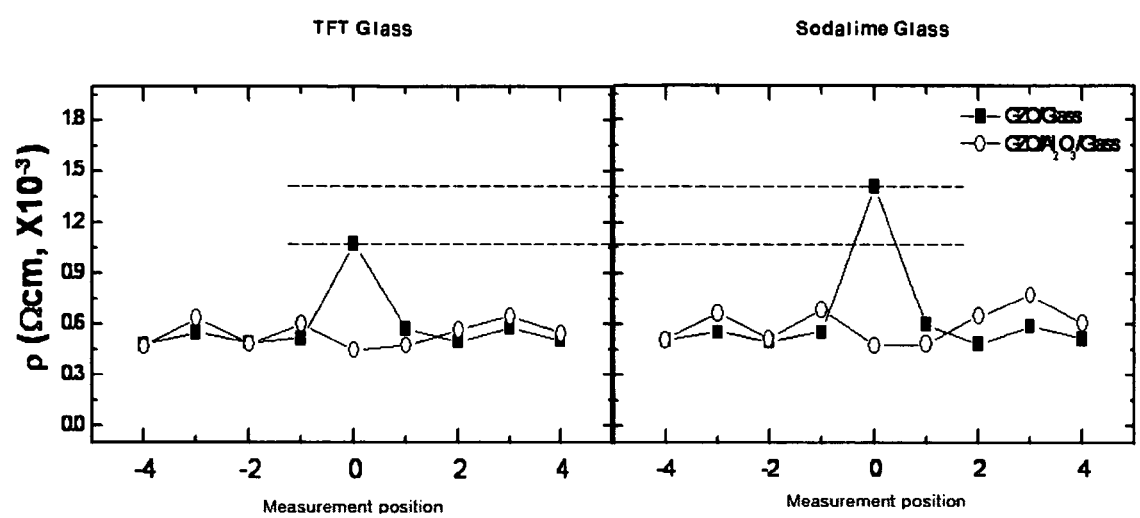
FIG. 9 illustrates the resistivities of transparent conductive films prepared according to Examples 3 and 4, and Comparative Examples 2 and 3, which are measured at predetermined positions on the conductive films.

FIG. 9 illustrates the resistivities of transparent conductive films prepared according to Examples 3 and 4, and Comparative Examples 2 and 3, which are measured at predetermined positions on the conductive films. When a metal interlayer was not used, the resistivity at a middle portion of each substrate is different according to the kinds of a glass substrate. However, the use of the interlayer results in relatively uniform distribution of resistivities regardless of the kinds of glass.

Experimental Example 2

On each of transparent conductive films prepared according to Examples 5 and 6, and Comparative Example 5 to 8, before and after a constant temperature and humidity test, the change in resistivity was measured. Table 1 shows the results. The constant temperature and humidity test was performed at 64° C., at relative humidity of 93%, for 42 hours.

TABLE 1

| Test Sample | Thickness of GZO | Increased rate of resistivity |
|---|---|---|
| Comp. Exp. 5 (GZO/Glass) | GZO ≈ 150 nm | 10% |
| Comp. Exp. 6 (GZO/Glass + H2) | | 16% |
| Exp. 5 (GZO/Al2O3/Glass + H2) | | 4% |
| Comp. Exp. 8 (GZO/Glass + H2) | GZO ≈ 30 nm | 690 times |
| Exp. 6 (GZO/Al2O3/Glass + H2) | | 19 times |

As noted in Table 1, regardless of the thickness of zinc oxide-based transparent conductive films, there is almost similar tendency in electrical properties, but when the thickness of zinc oxide-based transparent conductive films is thinner, the increase in the resistivity is more significant. Especially, at a constant temperature and humidity test using hydrogen, before the test, the resistivity of the transparent conductive film is decreased, but after the test, the increase in the resistivity is significant. Such an increase in the resistivity can be significantly decreased by using an aluminum oxide interlayer. Therefore, it is determined that the interlayer allows the heat-resistance/moisture-resistance to be improved.

This result can be found by XRD analysis. Table 2 shows the results.

TABLE 2

| | Peak position & Intensity Fitting | | | |
|---|---|---|---|---|
| Test Sample | Peak position 2θ(°) | Intensity (cts/sec) | width | Crystalline size (Å) |
| Comp. Exp. 5 (GZO/Glass) | 34.298 | 9214.00 | 0.84251 | 103.09 |
| Comp. Exp. 6 (GZO/Glass + H2) | 34.273 | 8179.00 | 0.76082 | 114.15 |
| Exp. 5 (GZO/Al2O3/Glass + H2) | 34.381 | 29053.00 | 0.28788 | 301.78 |

In Comparative Example 5 (GZO/glass) where hydrogen gas was not used and only GZO was grown on a glass substrate, the peak is very broad, and it seems as if there are two peaks because the peak becomes asymmetric because of damage. Also, there is a possibility that the peak is separated into two peaks. Comparative Example 6 (GZO/glass, $H_2$ flow) using hydrogen shows a similar peak to that of Comparative Example 5. On the other hand, in Example 5 (GZO/Al$_2$O$_3$/glass, $H_2$ flow) where an Al$_2$O$_3$ interlayer was included and hydrogen was used, the peak is shifted to a higher angle (that is, ~34.28°→34.38), the width became sharpened, and the shape became symmetric.

INDUSTRIAL APPLICABILITY

As can be seen from the foregoing, according to the present invention provides a conductive laminated body including a metal oxide interlayer of an oxidation number +3, between a substrate and a zinc oxide layer. Therefore, it is possible to improve electrical properties of a transparent conductive thin film, especially, a resistivity property, and to minimize the unevenness in electrical properties between a middle portion and a circumferential portion on the surface of the thin film in sputtering deposition. Also, in deposition of a zinc oxide film, in addition to inert gas such as argon gas, the use of hydrogen gas can improve the concentration of electrons, and herein, the interposition of an interlayer including a metal oxide, between the substrate and the zinc oxide-based transparent conductive film, allows the heat-resistance/moisture-resistance stability and the uniformity of electrical properties.

While this invention has been described in connection with what is presently considered to be the most practical and exemplary embodiment, it is to be understood that the invention is not limited to the disclosed embodiment and the drawings, but, on the contrary, it is intended to cover various modifications and variations within the spirit and scope of the appended claims.

The invention claimed is:
1. A conductive laminated body comprising:
a substrate;
a zinc oxide-based thin film doped with an element M; and
an interlayer comprising an oxide M'$_2$O$_3$, which is interposed between the substrate and the zinc oxide-based thin film,
wherein the zinc oxide-based thin film has a second XRD peak, which is shifted by +0.05°~+0.5° from a first XRD peak occurring when there is no interlayer, and
wherein each of M and M' is independently an element selected from the group consisting of group 13 elements and transition metals having an oxidation number of +3, provided that M' is not Al, and the first XRD peak and the second XRD peak correspond to a (002) peak of zinc oxide (ZnO) at 2θ=34°±0.5° at CuKα($\lambda$=0.154 nm) radiation.

2. The conductive laminated body according to claim 1, wherein content of a dopant element M included in the zinc oxide-based thin film is in a range of 0.1 to 10 wt %.

3. The conductive laminated body according to claim 1, wherein the dopant element M is Al or Ga, and the oxide $M'_2O_3$ is $Ga_2O_3$.

4. The conductive laminated body according to claim 1, wherein the substrate is a glass substrate.

5. The conductive laminated body according to claim 1, wherein interstitial oxygen defects (Oi) existing within the zinc oxide-based thin film are decreased by the interlayer comprising the oxide $M'_2O_3$.

6. The conductive laminated body according to claim 1, wherein a variation in resistivities measured on at least two spots of a surface of the zinc oxide-based thin film is within a range of 0.01~60% due to the interlayer comprising the oxide $M'_2O_3$.

7. The conductive laminated body according to claim 1, wherein a thickness of each of the interlayer and the zinc oxide-based thin film is within a range of 10 to 300 nm.

8. The conductive laminated body according to claim 1, wherein a cation M' of the oxide included in the interlayer, and the dopant element M included in the zinc oxide-based thin film are the same elements.

9. A method for preparing the conductive laminated body as defined in claim 1, the method comprising the steps of:
 a) forming an interlayer comprising an oxide $M'_2O_3$ on a substrate; and
 b) forming a zinc oxide-based thin film doped with an element M on the interlayer,
 wherein each of M and M' is independently an element selected from the group consisting of group 13 elements and transition metals having an oxidation number of +3, provided that M' is not Al.

10. The method according to claim 9, wherein the zinc oxide-based thin film is deposited by sputtering.

11. The method according to claim 9, wherein the zinc oxide-based thin film is deposited at the temperature ranging from 100 to 400° C.

12. The method according to claim 9,
 wherein the zinc oxide-based thin film is deposited in gas comprising hydrogen.

13. The method according to claim 12, wherein the hydrogen is included in an amount of 0.1 to 20 vol % based on the total gas.

14. The method according to claim 12, wherein the substrate is a glass substrate or a polymer substrate having heat-resistance at 100-400° C.

15. The method according to claim 12, wherein the zinc oxide-based thin film is deposited by sputtering.

16. The method according to claim 12, wherein the zinc oxide-based thin film is deposited at the temperature ranging from 100 to 400° C.

* * * * *